(12) United States Patent
Stobbs

(10) Patent No.: US 6,597,597 B2
(45) Date of Patent: Jul. 22, 2003

(54) LOW TEMPERATURE ATTACHING PROCESS FOR MRAM COMPONENTS

(75) Inventor: Colin Andrew Stobbs, Boise, ID (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 10/053,385

(22) Filed: Nov. 13, 2001

(65) Prior Publication Data

US 2003/0090931 A1 May 15, 2003

(51) Int. Cl.$^7$ ................................................. G11C 5/08
(52) U.S. Cl. ........................ 365/66; 365/63; 365/51; 365/173; 365/171; 365/158; 438/107; 438/106
(58) Field of Search .................. 365/173, 171, 365/158, 51, 66, 63; 438/3, 107, 106

(56) References Cited

U.S. PATENT DOCUMENTS 5,640,343 A    6/1997  Gallagher et al. ......... 365/171
6,163,477 A *  12/2000 Tran ........................... 365/173
6,205,052 B1 *  3/2001 Slaughter et al. .......... 365/173

* cited by examiner

Primary Examiner—Andrew Q. Tran

(57) ABSTRACT

A method is provided for electrically coupling a magnetoresistive memory MRAM circuit component to a host component. The method includes keeping the temperature of the MRAM circuit component below about 200° C. while aligning at least one interface feature of the MRAM circuit component with at least one interface feature of the host component and electrically coupling the interface features using a z-axis conductive material. In certain exemplary implementations, the temperature of the magnetoresistive memory circuit component is kept below about 180° C. It has been found that lower temperatures such as these eliminate the need to conduct additional MRAM annealing processes to re-set/re-pin a selected magnetic direction in certain materials within the MRAM.

13 Claims, 2 Drawing Sheets

LOW TEMPERATURE ATTACHING PROCESS FOR MRAM COMPONENTS

TECHNICAL FIELD

The present invention relates generally to the manufacture of electronic circuitry, and more particularly to methods and apparatuses for attaching magnetoresistive random access memory (MRAM) components to other components.

BACKGROUND

Magnetoresistive random access memory (MRAM) represents a new form of nonvolatile memory chip. Conventional forms of memory, such as, e.g., static RAM (SRAM), dynamic RAM (DRAM), electrically erasable programmable read only memory (EEPROM), are based on the storage of electrical charges in discrete circuit components. The presence of an electrical charge or the absence thereof can be used to represent binary data values (i.e., a "1" or a "0"). MRAM, however, is based on a different principle. MRAM uses the spin of an electron, rather than its charge, to indicate the presence of a 1 or a 0.

The MRAM magnetic stack tends to be sensitive to high temperatures. Unfortunately, high temperatures are typically reached during the attaching processes in the manufacture of similar conventional memory circuit components. Consequently, there is a need for new methods and apparatuses for use in the attaching processes while the manufacturing of components with MRAM circuitry.

SUMMARY

The above stated needs and others are met, for example, by a method for electrically coupling a magnetoresistive memory circuit component to a host component. The method includes keeping the temperature of the magnetoresistive memory circuit component below about 200° C. while aligning at least one interface feature of the magnetoresistive memory circuit component with at least one interface feature of the host component and electrically coupling the interface features using a z-axis conductive material. In certain exemplary implementations, the temperature of the magnetoresistive memory circuit component is further keep below about 180° C. It has been found that lower temperatures such as these eliminate the need to conduct additional costly MRAM annealing processes that re-set selected magnetic directions for materials within the MRAM.

BRIEF DESCRIPTION OF THE DRAWINGS

A more complete understanding of the various methods and apparatuses of the present invention may be had by reference to the following detailed description when taken in conjunction with the accompanying drawings wherein.

DETAILED DESCRIPTION

Magnetoresistive Random Access Memory (MRAM) represents a new form of nonvolatile memory chip. Conventional forms of memory, such as, e.g., static RAM (SRAM), dynamic RAM (DRAM), electrically erasable programmable read only memory (EEPROM), are based on the storage of electrical charges in discrete circuit components. The presence of an electrical charge or the absence thereof can be used to represent binary data values (i.e., a "1" or a "0"). MRAM, however, is based on a different principle. MRAM uses the spin of an electron, rather than its charge, to indicate the presence of a "1" or a "0".

Figure 1:
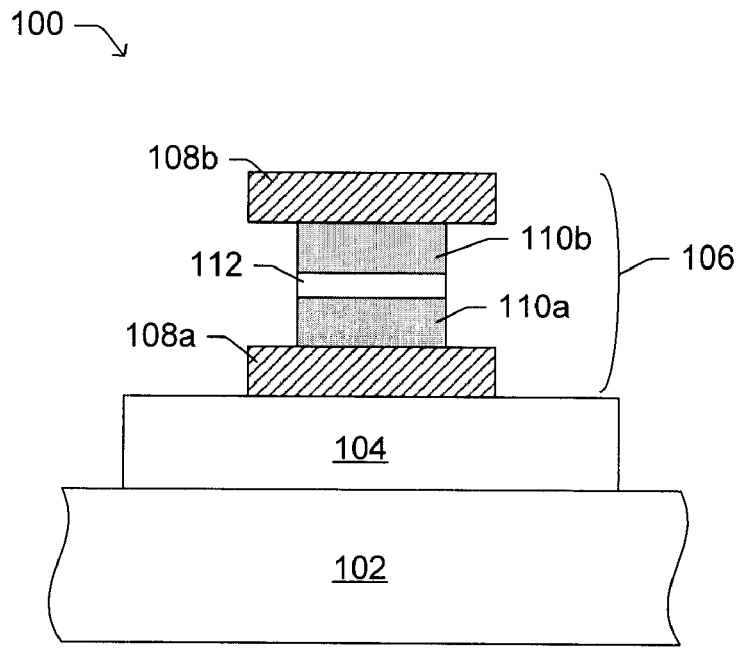
FIG. 1 is an illustrative view of a cross-section of a portion of an exemplary Magnetoresistive Random Access Memory (MRAM) integrated circuit.

Reference is now made to FIG. 1, which is an illustrative view of a cross-section of a portion of an exemplary MRAM integrated circuit component 100. MRAM integrated circuit component 100 includes a substrate 102 upon and/or within which is formed an integrated circuit region 104. Integrated circuit region 104 is representative of various circuitry operatively supportive of the MRAM cells. Since the placement, arrangement and functioning of such circuitry in region 104 is unimportant to the understanding of the present invention it will not be described in greater detail.

MRAM component 100 further includes two sets of conducting paths arranged one above the other. The conductive paths are represented here by opposing single conducting paths 108a and 108b.

The two sets of conductive paths (i.e., a first and a second set of conducting paths) are separated by one or more "sandwiched" layers and are oriented such that a plurality of cross points are formed between the conductive paths. Here, layers 110a–b and 112 represent the sandwiched layers.

It is at these cross points that a MRAM cell 106 is formed. In certain MRAM designs, the sandwiched layers in each cell form a magnetic tunnel junction (MTJ) using two magnetic layers 110a–b separated by a tunneling barrier layer 112. The resulting layout of the MRAM places the cells in an x, y grid pattern with the first set of conductive paths parallel to the x axis (e.g., forming word lines) and the second set of conductive paths parallel to the y axis (e.g., forming bit lines).

When an electrical current flows through a conductive path, a magnetic field is formed around the conductive path. This magnetic field is used to orient the magnetic layers within a given cell 106 in a certain direction with respect to the conductive path and the direction of the current flow. In this manner, binary data values can be written to each cell 106. Thus, a binary data value can be stored in the alignment of magnetic moments or directions. The resistance of the magnetic component in cell 106 depends on the alignment of the magnetic directions. Consequently, the stored binary state of cell 106 can be read by detecting the resistive state of cell 106. Here, the cell's resistance depends on the relative directional orientation between magnetic layers 110a and 110b. The resistance is at a maximum when the magnetic directions are antiparallel and a minimum when the magnetic directions are parallel. Hence, in summary, MRAM uses electrically configurable magnetic directions to provide information storage and the resultant electrically resistive difference for information readout. For additional information about MRAM see U.S. Pat. No. 5,640,343, issued to Gallagher et al., which is incorporated herein by reference.

During manufacture, the magnetic direction of one of the magnetic layers is permanently set or pinned. The magnetic layer that is pinned, essentially serves as a reference. The magnetic direction of the other magnetic layer is allowed to change according to the write signals applied to cell 106.

The magnetic direction of one of the magnetic layers can be pinned in a certain direction, for example, by placing the MRAM in a controlled magnetic field at a high temperature (e.g., greater than 200° C., for a certain amount of time. Thus, the magnetic direction can be pinned via this special annealing process.

The resulting MRAM die can then be placed inside a chip package, or directly applied to another circuit die or a circuit board, for example. It has been found that if the attaching process causes the temperature of the MRAM die to exceed a certain threshold temperature, then the direction of the magnetic field that was pinned during the special annealing process may change and become unpinned.

Unfortunately, many of the die or chip attaching processes regularly exceed the threshold temperature. For example, conventional surface mounting processes and wire bonding processes can cause the temperature of the MRAM die to exceed the threshold temperature.

If the magnetic field becomes unpinned, then the MRAM die will need to be re-annealed to once again pin the direction of the magnetic field. This adds additional processing time and expense during manufacture. The re-annealing process also needs to be designed to avoid damaging other components/connections in the product containing the MRAM die. Such re-annealing processes may require special equipment. For these and other reasons, there is a need for improved processes that eliminate the need for subsequent re-annealing of the MRAM.

In accordance with certain aspects of the present invention, a z-axis conductive material is used to attach the MRAM die or a chip package containing an MRAM die (i.e., an MRAM chip) to another die, chip, circuit board, or the like, in a low temperature MRAM component attaching process.

Figure 2:
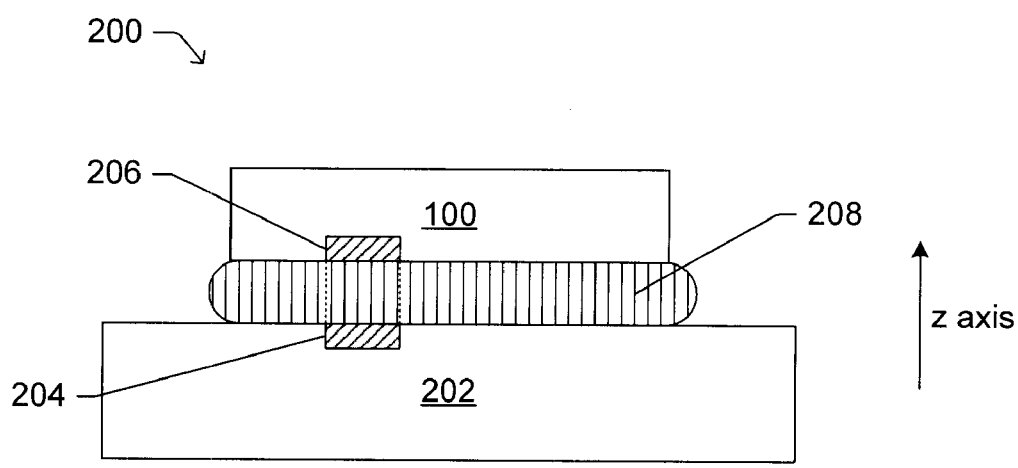
FIG. 2 is an illustrative view of a cross-section of a portion of an apparatus comprising an MRAM integrated circuit, e.g., as in FIG. 1, in accordance with certain exemplary implementations of the present invention.

Attention is drawn to FIG. 2, which is an illustrative view of a cross-section of a portion of an apparatus 200 comprising an MRAM integrated circuit component 100 electrically coupled to a host component 202 via z-axis conductive material 208, in accordance with certain exemplary implementations of the present invention. Host component 202 is representative of a package component, an integrated chip component, a circuit board component, and the like. Here, for demonstrative purposes, host component 202 is depicted as having operatively arranged therein/thereon a conductive or semiconductive interface feature 204. Interface feature 204 is electrically coupled (through z-axis conductive material 208) to a conductive or semiconductive interface feature 206 operatively arranged as part of MRAM component 100.

By way of example, interface features 204 and/or 206 may include pads, wires, bumps, contacts, electrodes, or any other type of electrically conductive/semiconductive feature. In this example, interface features 204 and 206 are properly aligned in a manner that allows a conductive path to be completed through z-axis conductive material 208.

Z-axis conductive material 208 is currently available in a variety of forms. For example, z-axis conductive material 208 may be provided as a liquid, a paste or a solid strip or tape. Although not necessary for the present invention, z-axis conductive material 208 may also be configured to provide a physical bond between interface features 204 and 206, and/or surface portions of components 100 and 202.

Figure 3:
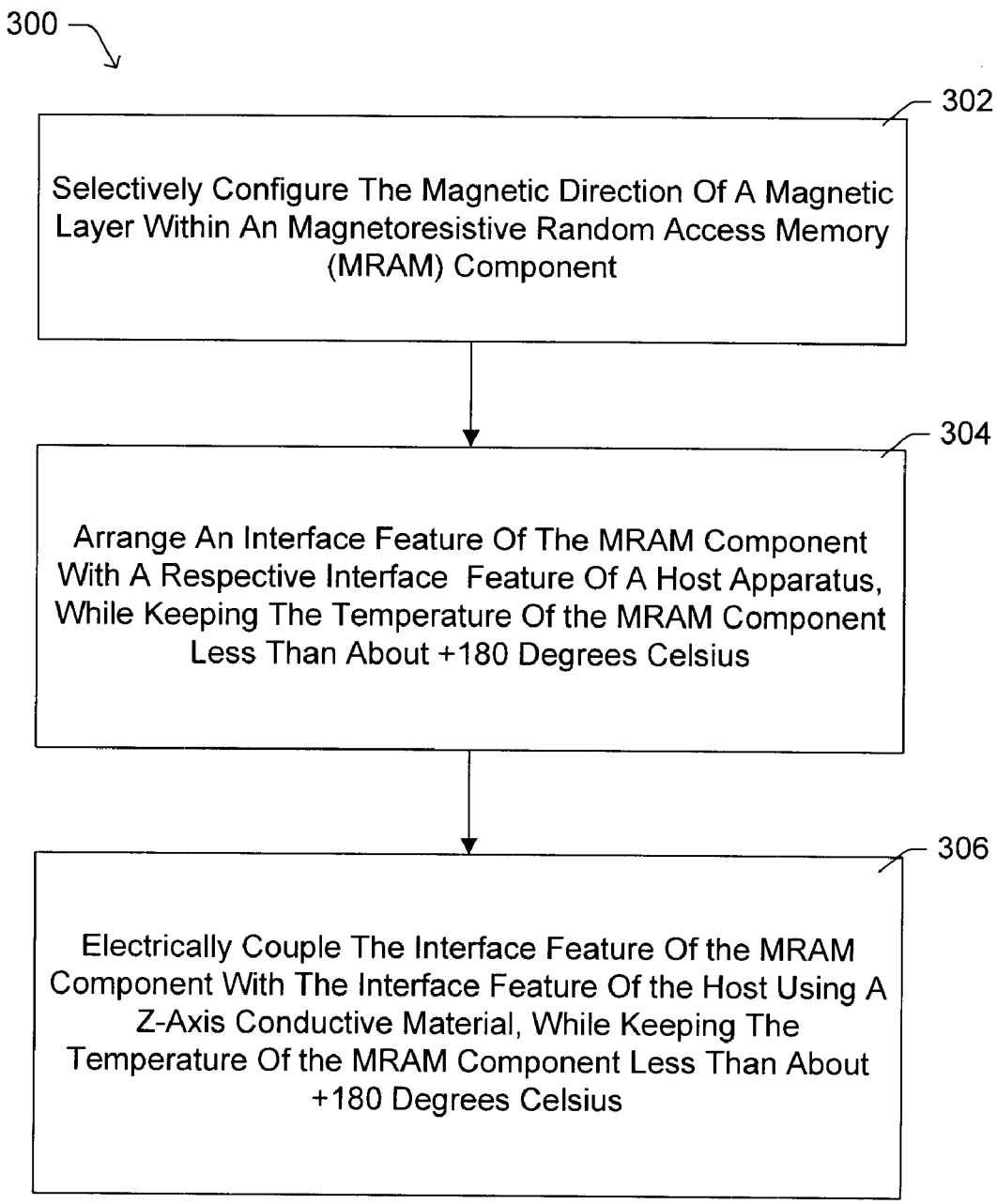
FIG. 3 is a flow diagram depicting a low temperature MRAM integrated circuit attaching process, in accordance with certain exemplary implementations of the present invention.

Attention is now drawn to FIG. 3, which is a flow diagram depicting an exemplary low temperature MRAM integrated circuit attaching process 300, in accordance with certain implementations of the present invention. Here, process 300 advantageously keeps the temperature of MRAM component 100 below the threshold temperature, and therefore eliminates the need for a subsequent re-annealing process. By way of example, in accordance with certain aspects of the present invention, it has been experimentally determined that the threshold temperature for most MRAM components is between about 180° C. and about 200° C.

With this in mind, in step 302, MRAM component 100 is subjected to a magnetic pinning/annealing process, wherein the magnetic direction of a magnetic layer is set to a specific direction. Next, in steps 304 and 306, the temperature of MRAM component 100 is keep below about 200° C., and more preferably below about 180° C. In step 304, interface features 204 and 206 are aligned, as needed. In step 306, interface features 204 and 206 are electrically coupled using z-axis conductive material 208. In certain implementations, steps 304 and 306 occur simultaneously, while in other implementations these are discrete steps.

Although some preferred embodiments of the various methods and apparatuses of the present invention have been illustrated in the accompanying drawings and described in the foregoing detailed description, it will be understood that the invention is not limited to the exemplary implementations disclosed, but is capable of numerous rearrangements, modifications and substitutions without departing from the spirit of the invention as set forth and defined by the following claims.

What is claimed is:

1. A method for electrically coupling a magnetoresistive memory circuit component to a host component, the method comprising:

while keeping a temperature of the magnetoresistive memory circuit component below about 200° C.:
aligning at least one interface feature of the magnetoresistive memory circuit component with at least one interface feature of the host component; and
electrically coupling said at least one interface feature of the magnetoresistive memory circuit component with said at least one interface feature of the host component using a z-axis conductive material.

2. The method as recited in claim 1, wherein keeping said temperature of the magnetoresistive memory circuit component below about 200° C. further includes keeping said temperature of the magnetoresistive memory circuit component below about 180° C.

3. The method as recited in claim 1, wherein the magnetoresistive memory circuit component is selected from a group of component types comprising a die, a chip, a module, and a circuit board.

4. The method as recited in claim 1, wherein the host component is selected from a group of component types comprising a die, a chip, a module, a package, and a circuit board.

5. The method as recited in claim 1, wherein said at least one interface feature of the magnetoresistive memory circuit component is selected from a group of interface features comprising pads, wires, bumps, contacts, and electrodes.

6. The method as recited in claim 1, wherein said at least one interface feature of the host component is selected from a group of interface features comprising pads, wires, bumps, contacts, and electrodes.

7. The method as recited in claim 1, wherein the magnetoresistive memory circuit component includes a magnetoresistive random access memory (MRAM) circuit.

8. An apparatus comprising:
   a magnetoresistive memory circuit component having a plurality of memory interface features;
   a host component having a plurality of host interface features; and
   a layer of z-axis conductive material in electrical contact between at least a portion of said plurality of memory interface features and at least a portion of said plurality of host interface features.

9. The apparatus as recited in claim 8, wherein the magnetoresistive memory circuit component is selected from a group of component types comprising a die, a chip, a module, and a circuit board.

10. The apparatus as recited in claim 8, wherein the host component is selected from a group of component types comprising a die, a chip, a module, a package, and a circuit board.

11. The apparatus as recited in claim 8, wherein at least one of said at least a portion of said plurality of memory interface features is selected from a group of interface features comprising pads, wires, bumps, contacts, and electrodes.

12. The apparatus as recited in claim 8, wherein at least one of said at least a portion of said plurality of host interface features is selected from a group of interface features comprising pads, wires, bumps, contacts, and electrodes.

13. The apparatus as recited in claim 8, wherein the magnetoresistive memory circuit component includes a magnetoresistive random access memory (MRAM) circuit.

\* \* \* \* \*